US009146268B2

(12) United States Patent
Emanuel et al.

(10) Patent No.: US 9,146,268 B2
(45) Date of Patent: Sep. 29, 2015

(54) METHOD AND DEVICE FOR MONITORING A SHEATH VOLTAGE ARRESTER OF A CABLE SYSTEM

(75) Inventors: Harald Emanuel, Berlin (DE); Ronald Plath, Berlin (DE); Ole Kessler, Berlin (DE)

(73) Assignee: OMICRON ELECTRONICS GMBH, Klaus (AT)

( * ) Notice: Subject to any disclaimer, the term of this patent is extended or adjusted under 35 U.S.C. 154(b) by 557 days.

(21) Appl. No.: 13/151,006

(22) Filed: Jun. 1, 2011

(65) Prior Publication Data

US 2011/0298475 A1 Dec. 8, 2011

(30) Foreign Application Priority Data

Jun. 2, 2010 (EP) ..................................... 10005744

(51) Int. Cl.
*H01C 7/102* (2006.01)
*G01R 31/12* (2006.01)

(52) U.S. Cl.
CPC .................................. *G01R 31/1236* (2013.01)

(58) Field of Classification Search
CPC ............. H01C 7/112; H01C 17/06546; H01C 17/285; H01C 7/102; H01C 1/02; H01C 1/034; H01C 7/10; H01C 7/105; H01C 7/12; G01R 31/083; G01R 31/1236; G01R 31/3277
USPC ......................................................... 324/615
See application file for complete search history.

(56) References Cited

U.S. PATENT DOCUMENTS

| 4,161,012 | A | * | 7/1979 | Cunningham | 361/128 |
| 5,325,087 | A | * | 6/1994 | Mikli | 340/635 |
| 6,100,699 | A | * | 8/2000 | Eslambolchi et al. | 324/529 |
| 6,651,020 | B2 | * | 11/2003 | More | 702/99 |
| 7,336,193 | B2 | * | 2/2008 | Schillert et al. | 340/664 |
| 7,656,639 | B2 | * | 2/2010 | Woodworth et al. | 361/127 |
| 7,843,188 | B2 | * | 11/2010 | Harres | 324/126 |
| 8,446,703 | B2 | * | 5/2013 | Klaube et al. | 361/117 |
| 2007/0297114 | A1 | * | 12/2007 | Woodworth et al. | 361/118 |
| 2010/0123356 | A1 | * | 5/2010 | Sihler et al. | 307/105 |

FOREIGN PATENT DOCUMENTS

| DE | 19629481 | 1/1998 |
| JP | 3001476 | 1/1991 |

OTHER PUBLICATIONS

Petry W et al. "Einleiterkabel Mit Ausgekreuzten Maenteln".
Parmigiani B; Quaggia D; Elli E; Franchina S: "Zinc Oxide Sheath Voltale Limiter for HV and EHV Power Cable: Field Experience and Laboratory Tests".

(Continued)

*Primary Examiner* — Tung X Nguyen
*Assistant Examiner* — Alesa Allgood
(74) *Attorney, Agent, or Firm* — Workman Nydegger

(57) ABSTRACT

Method and device for monitoring the status of a sheath voltage arrester of a cable system, a verification signal being supplied to a measuring loop which comprises the sheath voltage arrester and a measurement signal which is subsequently produced in accordance with the frequency-dependent impedance of the sheath voltage arrester being measured at the measuring loop in order to establish the status of the sheath voltage arrester by evaluating the measurement signal.

20 Claims, 2 Drawing Sheets

(56) References Cited

OTHER PUBLICATIONS

Figure 1:
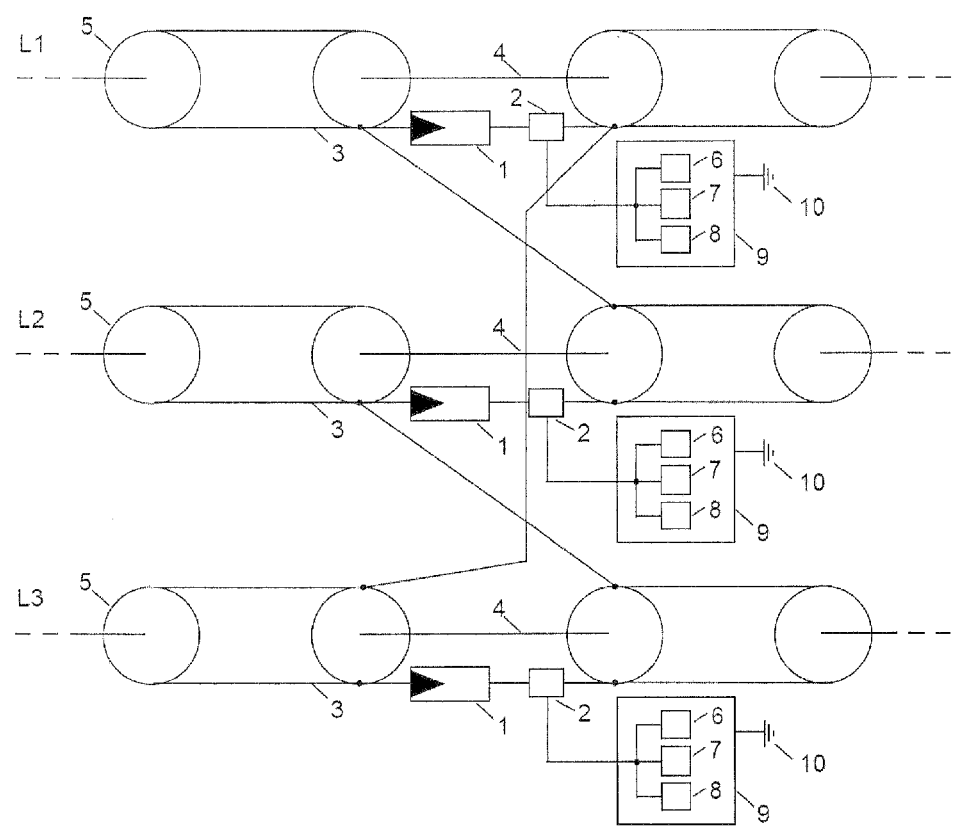

Fruth B A et al. "Combination of Frequency Spectrum Analysis and Partial Discharge Pattern Recording".

P. Mohaupt; M. Gamlin; R. Gleyvod; J. Kraus; G. Voigt: "High Voltage Testing Using Serias Resonance With Variable Frequency".

Osztermayer J; Cardillo E; Markalous S M; Wimmer R; Lenz M; Hoek S M; Feser K: "Asset Management Based an Improved Online Monitoring Systems Applied to a 110/380 kV Substation".

* cited by examiner

METHOD AND DEVICE FOR MONITORING A SHEATH VOLTAGE ARRESTER OF A CABLE SYSTEM

CROSS-REFERENCE TO RELATED APPLICATIONS

The present application claims the benefit under 35 U.S.C. §119 of European Patent Application EP 10 005 744.7 filed Jun. 2, 2010, herein incorporated by reference in its entirety.

DESCRIPTION

The present invention relates to a method and a device for monitoring a sheath voltage arrester of a cable system, in particular a high or maximum voltage cable system of an electrical energy supply system.

Sheath voltage arresters are used as surge voltage arresters in electrical energy supply systems in order to limit transient surge voltages, such as, for example, switching surge voltages and lightning surge voltages, and to prevent failure of the insulation of the respective operating means. Sheath voltage arresters are conventionally installed in cable systems on sleeves and are typically located between the sheath of the cable which is connected to the sleeve and the earthing or between two sheaths of two cable phases if the system is a cable system with so-called transposition sleeves or cross-bonding sleeves. In multi-phase cable systems, the object of the individual sheath voltage arresters is to transpose the sheath screens of the individual phases in order to reduce induced sheath current losses and, in the event of malfunction, to limit potential differences between the individual cable sheaths or to discharge transient surge voltages into the earth.

In order to ensure correct operation of such sheath voltage arresters, reliable arrester monitoring is required in order to be able to monitor the current status of the respective sheath voltage arrester. As already explained, the significant function of a sheath voltage arrester is to discharge transient surge voltages by the sheath voltage arrester, owing to its non-linear resistance characteristic, briefly moving from a high-ohm operating state into a good conducting state. The sheath voltage arrester converts the energy of the arrester current which occurs in this instance into heat. If the energy in the arrester exceeds the maximum energy that can be discharged, in addition to the actual operating state and the conductive state, there may occur another state in which the arrester is destroyed and there is no connection between the cable sheath and the earth potential.

An object of the present invention is to provide a method and a device for monitoring a sheath voltage arrester of a cable system, by means of which the status of the sheath voltage arrester can be reliably monitored in a simple manner.

This object is achieved according to the invention by a device for monitoring a sheath voltage arrester of a cable system having the features of patent claim 1 and a method having the features of patent claim 17. The dependent patent claims define preferred and/or advantageous embodiments of the present invention.

According to the invention, in order to monitor a sheath voltage arrester of a cable system, a verification signal is supplied to a measuring loop which contains the sheath voltage arrester in order to be able to establish the status of the sheath voltage arrester by evaluating a measurement signal which is measured at the measuring loop and which is dependent on the frequency-dependent impedance of the sheath voltage arrester.

The frequency spectrum of the measurement signal is preferably evaluated, with the arrester impedance and the cable impedance being interconnected to form an oscillating circuit according to a preferred embodiment so that the sheath status can be derived, for example from the position or amplitude of the resonance frequency of this oscillating circuit.

As a verification signal, it is possible to introduce a calibration pulse, preferably a low-voltage pulse, into the measuring loop. It is also possible to supply a verification signal which varies in terms of its curve shape, amplitude and/or frequency over time, the verification signal also being able to be a noise signal or a wobble signal. The introduction of the verification signal can preferably be carried out in the shield system of a cable sleeve of the cable system to be monitored, the introduction of the verification signal and the detection of the measurement signal preferably also being carried out by the same device, which can further also be configured for measuring partial discharges.

According to a preferred configuration, the introduction of the verification signal can be carried out by means of a sensor which is fitted close to the sheath voltage arrester, the introduction or coupling-in of the verification signal and the detection or decoupling of the measurement signal preferably being carried out in a galvanically decoupled manner, inductive sensors being able to be used, for example, for this purpose.

The present invention allows reliable continuous monitoring of sheath voltage arresters during operation of the respective cable system, the monitoring being able to be carried out automatically in a computer-assisted manner, without an operation being necessary on the respective sheath voltage arrester after the one-off installation. The evaluation of the measurement signal or the corresponding measurement data can be carried out in a processor unit which does not have to be located directly on the sheath voltage arrester or on the cable system.

The invention is preferably used for monitoring the status of sheath voltage arresters of a high/maximum voltage cable system which is an integral component of an energy supply system, but without being limited thereto.

Figure 2:
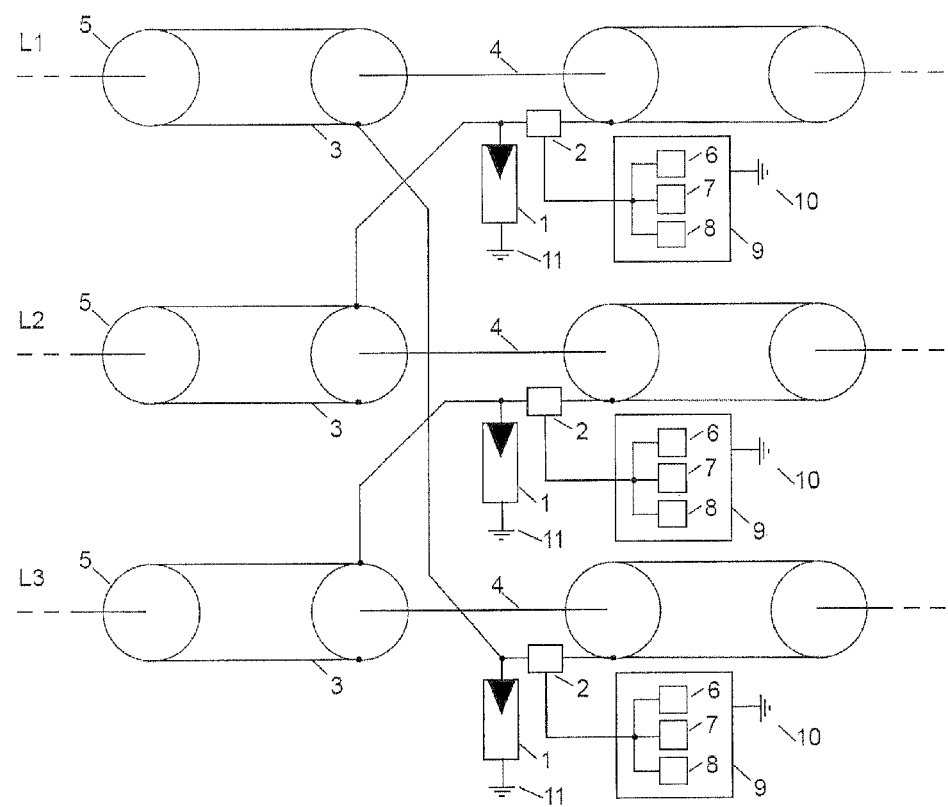

The invention is explained in greater detail below with reference to the appended drawing and with reference to preferred embodiments, in which:

FIG. 1 is a three-phase cable system having a device for monitoring the status of sheath voltage arresters of this three-phase cable system according to a first embodiment of the present invention, and FIG. 2 is a three-phase cable system having a device for monitoring the status of sheath voltage arresters of this three-phase cable system according to a second embodiment of the present invention.

FIG. 1 shows a portion of a three-phase cable system, with in particular a connection location of power cable part-paths 5 of the three-phase cable system being illustrated. A power cable with an inner conductor 4 and a cable sheath 3 is associated with each phase L1, L2 and L3, the cable sheaths 3 of the power cables of the respective phases L1, L2 and L3 being galvanically coupled to each other.

Between the cable sheaths 3 of two power cable part-paths of a phase there is provided in each case a sheath voltage arrester 1 which serves to discharge transient surge voltages by the sheath voltage arrester 1, owing to its non-linear resistance characteristic, briefly moving from the high-ohm operating state thereof in which the sheath voltage arrester has a constant capacitance into a good conducting state. The energy of the discharge current is converted into heat by the sheath voltage arrester. If the energy in the sheath voltage arrester exceeds the maximum energy that can be discharged, the sheath voltage arrester may be destroyed so that there is no connection between the respective cable sheath 3 and the earth potential.

In order to be able to continuously monitor the status of the individual sheath voltage arresters 1 in FIG. 1 during the operation of the three-phase cable system, according to FIG. 1 a measuring and monitoring system 9 is provided for each sheath voltage arrester 1, but with the functions of the individual measuring and monitoring systems 9 also being able to be carried out in a common measuring and monitoring unit. Each measuring and monitoring system 9 is earthed according to FIG. 1 (cf. reference numeral 10) and has a verification signal source 6 for producing a verification signal, a measuring device 7 for detecting and evaluating a measurement signal measured at the respective sheath voltage arrester 1 and a partial load discharge measuring device 8 for additionally carrying out a partial discharge measurement.

The verification signal produced by the verification signal source 6 is supplied to a measuring circuit or a measuring loop which contains the sheath voltage arrester 1 to be monitored in each case, the measuring device 7 detecting a measurement signal which is measured at the respective measuring loop and which changes in accordance with the frequency-dependent impedance of the sheath voltage arrester to be monitored in each case in order to establish the current status of the sheath voltage arrester 1 in each case by evaluating this measurement signal. In order to monitor the respective sheath voltage arrester, the frequency spectrum of the verification signal which is introduced into the respective arrester branch and which changes in accordance with the status of the respective sheath voltage arrester is preferably analysed (status 1: the arrester is operational and is fully functional and has a constant capacitance; status 2: the arrester has moved into the conductive state and a conductive channel has been produced in the arrester; status 3: the arrester is destroyed and there is no connection between the cable sheath 3 and the earth potential 10). By evaluating the frequency-dependent impedance of the respective measuring loop, which changes in accordance with the status of the sheath voltage arrester 1, it is possible to reliably establish the status of the sheath voltage arrester 1.

As a verification signal, it is possible to produce from the respective verification signal source 6 calibration pulses, preferably low-voltage pulses or the like, which are supplied to the shield system of a cable sleeve, to which the respective sheath voltage arrester is fitted. Generally, however, the verification signal may also be a signal which changes in terms of its curve shape, amplitude and/or repetition rate or frequency, the signal also being able in particular to be a wobble signal, that is to say, a signal with a frequency which changes periodically from a start value to an end value. The verification signal may also be a noise signal, it preferably being possible to use a signal with a band-limited white noise.

According to FIG. 1, the coupling of the verification signal into the respective measuring loop is carried out via a device 2, which performs several functions. On the one hand, using the device 2 which is preferably constructed in the form of a sensor, the verification signal is supplied to the respective measuring loop. On the other hand, the device 2 serves to decouple the measurement signal, that is to say, the verification signal response, in order to supply the measurement signal to the respective measuring device 7. Finally, the device 2 in the configuration illustrated in FIG. 1 also serves to measure the part discharge in combination with the part discharge measuring device 8 contained in the monitoring and measurement system 9 since the measurement signal, in addition to the actual verification signal, can also contain part discharge pulses which may occur in the insulation of the cable system.

According to a preferred configuration, the coupling of the verification signal into the respective measuring loop and the decoupling of the measurement signal measured at the respective measuring loop requires no galvanic connection to the respective sheath voltage arrester 1 so that the supply of the verification signal and the measurement signal decoupling can each be carried out in a state decoupled from the sheath voltage arrester 1. To this end, it is possible to use, for example, an inductive sensor 2 (for example, a "High Frequency Current Transformer" sensor). Such an inductive sensor 2 may comprise only one component or a plurality of components and have in the centre of the sensor an opening in which the arrester supply line to be measured in each case is placed. The inductive sensor has an earth connection and is separated by means of an insulation from the respective arrester supply line. Inductive sensors with two components are known as so-called "Split Core HFCTs" and allow assembly without previously opening sheath voltage arrester connections.

Generally, the sensor 2 provided for coupling the verification signal and decoupling the measurement signal is preferably arranged close to the sheath voltage arrester 1 to be monitored in each case, the sensor 2 being able to be located, for example, both above the sheath voltage arrester 1 and below the sheath voltage arrester 2. In order to additionally carry out a part discharge measurement, it may be advantageous for the sensor 2 to be located above the sheath voltage arrester 1 in order not to impair the sensitivity of the part discharge measurement.

The measurement signal decoupled via the respective sensor 2 is supplied to the measuring device 7 contained in the respective measuring and monitoring system 9, the measuring device 7 preferably being constructed in such a manner that it evaluates the frequency spectrum of the measurement signal, which changes in accordance with the frequency-dependent impedance of the sheath voltage arrester 1, in order to establish the status of the sheath voltage arrester 1. The components shown in FIG. 1 are preferably interconnected in such a manner that the impedance of the sheath voltage arrester 1, the impedance of the respective power cable 5 and the impedance of the respective sensor 2 form an oscillating circuit so that by evaluating a change of the amplitude and/or position of the resonance frequency of this oscillating circuit it is possible to establish the status of the sheath voltage arrester 1. A specific amplitude and position of the resonance frequency can be associated with each status of the sheath voltage arrester 1 so that, when a change of the amplitude or position of the resonance frequency is determined, the status of the sheath voltage arrester 1 can be established in a simple manner. To this end, the current measurement line of the measurement signal can be compared with a previously recorded and stored frequency spectrum of an operational sheath voltage arrester.

The measurement described above, which is preferably carried out in the frequency range, can under some circumstances be carried out in an environment on which interference signals are superimposed, whereby the evaluation of the measurement signal on which such interference signals are superimposed is made more difficult. Owing to differing signal processing methods (for example, correlation methods), the actual verification signal or the verification signal response can be found again in the measurement signal on which the interference signals are superimposed in order to consequently increase the precision of the monitoring of the status of the respective sheath voltage arrester 1.

The monitoring method described above with reference to FIG. 1 can be used both in cable systems which are operational and in cable systems which are disconnected from the energy supply network. Preferably, the monitoring method is carried out during operation, that is to say, on-line, in a cable system which is in a live state, no operation of the monitoring method on the individual sheath voltage arresters 1 being necessary after the one-off installation of the above-mentioned monitoring and measuring systems 9. The monitoring of the sheath voltage arrester 1 is preferably carried out in a processor- or computer-assisted manner, the evaluation of the measurement data being carried out in a processing unit which is preferably not located directly on the individual sheath voltage arresters 1 or close to the cable system to be monitored. To this end, the measuring and monitoring systems 9 which are illustrated in FIG. 1 can be integrated in a processing unit which is connected to the individual sensors 2 by means of a bus system.

FIG. 2 illustrates a second embodiment of the present invention, the components in FIG. 2 which correspond to the components illustrated in FIG. 1 being given the same reference numerals.

The embodiment illustrated in FIG. 2 differs from the embodiment illustrated in FIG. 1 only in that the individual sheath voltage arresters 1 are connected to earth and consequently each has an earthing 11. Each sensor is located above the sheath voltage arrester 1 to be monitored in each case and in a similar manner to FIG. 1 is connected to the respective measurement and monitoring system 9. Otherwise, the operating method of the embodiment illustrated in FIG. 2 corresponds to the embodiment illustrated in FIG. 1 so that reference can be made to the above explanations relating to FIG. 1.

The invention claimed is:

1. A device for monitoring a sheath voltage arrester of a cable system of an energy supply system, comprising:
   a verification signal source that produces a verification signal which is to be supplied to a measuring loop which comprises the sheath voltage arrester of the cable system of the energy supply system, and
   a measuring device that detects a measurement signal which is measured at the measuring loop and which is dependent on a frequency-dependent impedance of the sheath voltage arrester,
   wherein the measuring device establishes a status of the sheath voltage arrester by evaluating the measurement signal to determine (1) whether the sheath voltage arrester is fully functional, (2) whether the sheath voltage arrester has moved into a conductive state, a conductive channel being produced in the sheath voltage arrestor, and (3) whether the sheath voltage arrester has been destroyed, there being no connection between the sheath of the cable system and a ground potential.

2. The device according to claim 1, the verification signal source producing as the verification signal a pulse signal, a noise signal, or a signal which changes periodically in terms of its curve shape, amplitude and/or frequency.

3. The device according to claim 1, the verification signal source being coupled to the cable system in such a manner that the verification signal is supplied to a shield system of a cable sleeve to which the sheath voltage arrester is fitted.

4. The device according to claim 1, the measuring device being an integral component of a processor unit which is spatially remote from the cable system and the sheath voltage arrester, the processor unit being connected to the measuring loop via a line in order to transfer the measurement signal.

5. The device according to claim 1, the device being constructed for monitoring the sheath voltage arrester during operation of the cable system.

6. An energy supply system having a high-voltage cable system and a device according to claim 1 for monitoring at least one sheath voltage arrester of the high-voltage cable system.

7. The device according to claim 1, the verification signal source and the measuring device being contained in a device which is constructed in the form of an integral unit.

8. The device according to claim 7, the device having a part discharge measuring device for detecting part discharge pulses occurring at the cable system.

9. The device according to claim 1, a sensor for reading the measurement signal at the measuring loop being provided close to the sheath voltage arrester.

10. The device according to claim 9, the sensor being constructed in such a manner that the verification signal of the verification signal source can be supplied to the measuring loop by means of the sensor.

11. The device according to claim 9, the sensor being arranged above or below the sheath voltage arrester.

12. The device according to claim 9, the sensor being fitted around a line connected to the sheath voltage arrester.

13. The device according to claim 1, the verification signal of the verification signal source being supplied by the sheath voltage arrester to the measuring loop in a galvanically decoupled manner and the measurement signal being measured at the measuring loop in a galvanically decoupled state.

14. The device according to claim 13, the verification signal being supplied to the measuring loop by means of an inductive coupling and the measuring signal being measured at the measuring loop.

15. The device according to claim 1, the measuring device being configured for evaluating the frequency spectrum of the measurement signal in order to establish the status of the sheath voltage arrester by evaluating the frequency spectrum of the measurement signal.

16. The device according to claim 15, the sheath voltage arrester being interconnected with the cable system and the measuring device in such a manner that the impedance of the sheath voltage arrester and an impedance of the cable system are integral components of an oscillating circuit, and the measuring device being constructed in such a manner that, in order to identify the status of the sheath voltage arrester, it evaluates a position or amplitude of a resonance frequency of the oscillating circuit.

17. A method for monitoring a sheath voltage arrester of a cable system of an energy supply system comprising the steps of:
   supplying a verification signal to a measuring loop which comprises the sheath voltage arrester of the cable system of the energy supply system,
   detecting a measurement signal which is measured at the measuring loop and which is dependent on a frequency-dependent impedance of the sheath voltage arrester, and
   establishing a status of the sheath voltage arrester by evaluating the measurement signal to determine (1) whether the sheath voltage arrester is fully functional, (2) whether the sheath voltage arrester has moved into a conductive state, in which a conductive channel being produced in the sheath voltage arrester, and (3) whether the sheath voltage arrester has been destroyed, there being no connection between the sheath of the cable system and a ground potential.

18. The method according to claim 17, the method being carried out automatically in a computer-assisted manner.

19. The method according to claim 17, the method being carried out using a device according to claim 1.

20. A device for monitoring a sheath voltage arrester of a cable system of an energy supply system, comprising:

a verification signal source for producing a verification signal which is to be supplied to a measuring loop which comprises the sheath voltage arrester of the cable system of the energy supply system, the verification signal source being coupled to the cable system in such a manner that the verification signal is supplied to a shield system of a cable sleeve to which the sheath voltage arrester is fitted, a measuring device for detecting a measurement signal which is measured at the measuring loop and which is dependent on a frequency-dependent impedance of the sheath voltage arrester in order to establish a status of the sheath voltage arrester by evaluating the measurement signal, a sensor for reading the measurement signal at the measuring loop being provided in proximity to the sheath voltage arrester, the verification signal being supplied by the sheath voltage arrester to the measuring loop in a galvanically decoupled manner and the measurement signal being measured at the measuring loop in a galvanically decoupled state, and means for establishing a status of the sheath voltage arrester by evaluating the measurement signal to determine (1) whether the sheath voltage arrester is fully functional, (2) whether the sheath voltage arrester has moved into a conductive state, a conductive channel being produced in the sheath voltage arrester, and (3) whether the sheath voltage arrester has been destroyed, there being no connection between the sheath of the cable system and a ground potential.

* * * * *

UNITED STATES PATENT AND TRADEMARK OFFICE
CERTIFICATE OF CORRECTION

Page 1 of 1

PATENT NO.        : 9,146,268 B2
APPLICATION NO.   : 13/151006
DATED             : September 29, 2015
INVENTOR(S)       : Emanuel et al.

It is certified that error appears in the above-identified patent and that said Letters Patent is hereby corrected as shown below:

In the specification

Column 2
Line 42, change "drawing" to --drawings--

Column 3
Line 64, change "device 2" to --device 7--

Signed and Sealed this
Seventh Day of June, 2016

Michelle K. Lee
*Director of the United States Patent and Trademark Office*